United States Patent [19]

Götzenbrucker et al.

[11] Patent Number: 4,680,615
[45] Date of Patent: Jul. 14, 1987

[54] SILICON SEMICONDUCTOR COMPONENT WITH AN EDGE CONTOUR MADE BY AN ETCHING TECHNIQUE, AND METHOD FOR MANUFACTURING THIS COMPONENT

[75] Inventors: Oswald Götzenbrucker, Worms; Gerhard Popp, Lampertheim, both of Fed. Rep. of Germany

[73] Assignee: Brown, Boveri & Cie AG, Mannheim, Fed. Rep. of Germany

[21] Appl. No.: 744,811

[22] Filed: Jun. 14, 1985

[30] Foreign Application Priority Data

Jun. 14, 1984 [DE] Fed. Rep. of Germany ....... 3422051

[51] Int. Cl.$^4$ .................. H01L 29/06; H01L 21/306; B44C 1/22; C03C 15/00
[52] U.S. Cl. ................................. 357/55; 29/576 W; 29/580; 148/1.5; 156/648; 156/649; 156/657; 156/662; 357/56; 357/50
[58] Field of Search ............... 156/628, 648, 649, 651, 156/652, 657, 659.1, 661.1, 662; 29/576 W, 580; 148/1.5; 357/13, 16, 50, 56, 55; 428/156, 157, 446, 167, 170, 620, 173, 192

[56] References Cited

FOREIGN PATENT DOCUMENTS

| 2851375 | 6/1979 | Fed. Rep. of Germany . |
| 7926244 | 4/1981 | France . |
| 55-48933 | 4/1980 | Japan .................................. 156/651 |
| 0148371 | 9/1982 | Japan .................................. 156/649 |

OTHER PUBLICATIONS

IEEE-Transactions on Electron Devices, vol. ED-23, No. 8, Aug. 1976, pp. 950-955.
IEEE-Transactions on Electron Devices, vol. ED-27, No. 5, May 1980, pp. 977-982.

*Primary Examiner*—William A. Powell
*Attorney, Agent, or Firm*—Herbert L. Lerner; Laurence A. Greenberg

[57] ABSTRACT

Silicon semiconductor component with a wafer-like silicon semiconductor body with an edge contour made by an etching technique. The component has a p-region parallel to a principal surface of the semiconductor body and has in this principal surface a passivating ditch, into which leads a pn-junction extending between the more heavily doped p-region and a less heavily doped n-region, in which the edge contour has in the vicinity of a flank length, between the emergence of the pn-junction into the passivating ditch and this principal surface of the semiconductor body, a small angle of inclination of 1° to 7°. The angle of inclination ($\alpha$) of the edge contour is nearly uniform over the major part of the flank length (L) and the following relationships apply:

$L = (0.8 \ldots 1.6) \cdot x_n$ and
$H = (0.5 \ldots 1.2) \cdot x_p$, where
$H$ = the height of the p-doped silicon layer over the pn-junction, measured in the center of the flank length (L),
$x_n$ = the extent of the space charge zone into the n-region,
$x_p$ = the extent of the space charge zone into the p-region at the cut-off voltage of the component.

6 Claims, 8 Drawing Figures

SILICON SEMICONDUCTOR COMPONENT WITH AN EDGE CONTOUR MADE BY AN ETCHING TECHNIQUE, AND METHOD FOR MANUFACTURING THIS COMPONENT

BACKGROUND OF THE INVENTION

1. Field of the Invention

The invention relates to a silicon semiconductor component, with a wafer-like silicon semiconductor body with an edge contour made by an etching technique, which has a p-region parallel to a principal surface of the semiconductor body and has in this principal surface a passivating ditch, into which leads a pn-junction extending between the more heavily doped p-region and a less havily doped n-region, in which the edge contour has in the vicinity of a flank length, between the emergence of the pn-junction into the passivating ditch and this principal surface of the semiconductor body, a small angle of inclination of 1° to 7°.

2. Description of the Prior Art

Silicon semiconductor components are customarily produced by simultaneously producing several semiconductor components on a silicon wafer and separating them later, for instance by scribing, sawing or by means of a laser beam. A component edge is produced by the separation at which pn-junction barrier surfaces come to the surface and thereby come into contact with the atmosphere surrounding the component. The shape of the edge has considerable influence on the blocking voltage of the components that can be attained. The attempt is to bevel the edge of the component in such a way that an angle between the pn-junction surface and the component surface as flat as possible results, because thereby, lower and better manageable electric field strength are obtained at the surface. Such a desirable bevel of the edge can be obtained by etching a ditch.

For manufacturing components in Mesa technology, ditches are etched along the edges of the individual components on the silicon wafer. The ditches must be deep enough to separate the blocking pn-barrier junctions which are usually located at a depth of 60 to 80 μm. After the etching, the ditches are filled with a suitable passivating glass, so that the pn-junctions are covered up and are protected against influences of the environment.

Passivating ditches which are etched into the wafer along separation lines of the individual components are very popular.

The ditches are separated along their center line for dividing the wafer into individual components. Thereby, individual components are produced as shown by way of an example in FIG. 1. FIG. 1 shows a known silicon semiconductor component 1 in Mesa technology with its p and n-layers, a metallization 2 on the surfaces and with passivating glass 3 in the edge zone.

A disadvantage of this form of ditches is that cracks can occur in the passivating glass during the separation of the silicon wafer, for instance due to mechanical stresses, whereby the attainable blocking voltage is reduced.

Another known form of the passivating ditch is the so-called moat, which is shown in FIG. 2. In the moat, the active part of the silicon component 1 is separated from the not used edge portion or from an adjacent component by a separate ditch G which is filled with passivating glass 3. On a silicon wafer with several components which are to be separated later, ditches are made to the left and right of the separation lines provided and filled with glass. In separating the wafer into individual components, only silicon but no passivating glass is therefore separated. A disadvantage of the moat with the known edge contour is that as a rule, narrow ditches with steep flanks are made for reasons of space, which results in increased field strength which can lead to considerably reduced blocking voltages. In addition, it is difficult with ditches up to 100 μm deep, because of the large level difference, to cover the edges with passivating glass without defect.

German Published Non-Prosecuted Application (DE-OS) No. 28 51 375 discloses a design of the ditch for the manufacture of semiconductor components in Mesa technology which is suitable for components with a blocking voltage of up to about 1000 V. The ditch is made in two steps. For this purpose, a narrow deep ditch is etched first and subsequently, the ditch is widened in an upper region in a second etching operation. The entire ditch is filled with a passivating glass. The purpose of this arrangement is to keep traces of a metallization which is applied in a later process step and which could penetrate between the glass passivating layer and the silicon surface, away from the pn-junction surface, since the pn-junction surface lies in the vicinity of the narrow and steep portion of the ditch which is made first, as explained on page 6 of the cited published non-prosecuted application. It is therefore improbable that the metallization material travels the long path under the glass in the flat part of the ditch through to the steep part of the ditch. However, this arrangement has the same disadvantages with respect to the inverse voltage strength which had been mentioned, for instance for the customary moat with a pn-junction in a steep part of the ditch.

In the paper "The Theory and Application of a Simple Etch Contour for Near Breakdown Voltage in Plane and Planar p-Junctions" by V. A. K. Temple and M. S. Adler in IEEE Transactions of Electron Devices, Vol. ED-23, No. 8, August 1976, Pages 950 to 955 and in the paper "Practical Aspects of the Depletion Etch Method in High-Voltage Devices" by V. A. K. Temple in IEEE Transactions on Electron Devices, Vol. ED-27, No. 5, May 1980, Pages 977 to 982, an edge contour is described in which the space charge zone is etched in the diffused layer substantially parallel to the pn-junction surface. Such an edge contour is suitable for high breakdown voltages. The attainable breakdown voltages almost correspond to the bulk breakdown voltages. However, the etching depth optimum therefore must be reached very accurately. A small deviation from the optimum depth leads to a drastic decline of the breakdown voltage. It will be apparent that such a procedure and such an edge contour are not suitable for mass production. The method is described in the cited publications only for the production of individual elements. It is not suitable for the practical case where several chips are to be etched together on a silicon wafer as is customary, for instance in the manufacture of glass-passivated components. It would be impossible to observe the required narrow etching tolerances.

French Patent Application (FR-OS) No. 24 68 207 describes a silicon semiconductor component with a wafer-shaped silicon semiconductor body with an edge contour made by etching techniques in which the edge contour has a a small angle of inclination of less than 10° or less than 6° in a passivating ditch and the principal surface of the semiconductor body having the passivating ditch between the emergence of a pn-junction extending between a more heavily doped p-area and a less heavily doped n-area. In this publication, a first conductance type (p or n) and a second conductance type (n or p) is mentioned which means that the conductivities can be interchanged. The same applies, of course, also to the present invention in which a selected sequence of the conductivities is assumed for ease of description. According to French Patent Application (FR-OS) No. 24 68 207, one cannot get along without mechanical processing steps (grinding, sand-blasting) for the preparation of the ditches. After the mechanical processing step which determines substantially the ditch contour, chemical overetching follows in order to remove mechanically damaged layers. The edge contour is no longer changed substantially here. The mechanical preparation of the edge contour, particularly of moat ditches, is very costly.

SUMMARY OF THE INVENTION

An object of the invention is to provide a silicon semiconductor component with an edge contour made by etching techniques for high breakdown voltages and a method for manufacturing such a component, avoiding the above-mentioned disadvantages.

With the foregoing and other objects in view, there is provided in accordance with the invention a method for manufacturing a silicon semiconductor component with a wafer-like silicon semiconductor body with an edge contour made by an etching technique, which has a p-region parallel to a principal surface of the semiconductor body, a n-region beneath the p-region and a pn-region, a more heavily doped p-region and a less heavily doped n-region, a passivating ditch in the principal surface extending between the more heavily doped p-region and the less heavily doped n-region, and the pn-junction leading into the passivating ditch, in which the edge contour has a flank length L which runs between the emergence of the pn-junction into the passivating ditch and the principal surface of the semiconductor body, comprising the following process steps for preparing the passivating ditch:

(a) applying a first etching mask on the principal surface of the silicon semiconductor component with an opening in the etching mask above the region of a narrow first ditch to be formed, with the opening in the mask a small distance S to the edges of the etching mask from a reference surface M going through the center of the ditch, (b) etching the narrow ditch down to a first depth T1 which just goes beyond the pn-junction, (c) removing the first etching mask, (d) applying a second etching mask to the principal surface of the silicon semiconductor component, with an aperture of the second etching mask above the first ditch disposed asymmetrically to the reference surface M, in that the second etching mask terminates on the side of the not used edge region of the silicon semiconductor component approximately with the edge of the first ditch and terminates on the side of the active part of the silicon semiconductor component with a large distance R from the reference surface M, where the large distance R is chosen in relation to the small distance S of the first etching mask, according to the equation $$R - S = L + x_j/2,$$

where $x_j$ is the depth of the pn-junction below the principal surface, (e) etching a second passivating ditch in the region of the narrow first ditch prepared previously until the first ditch is etched further down to a second depth T2 and, on the side of the active part of the silicon semiconductor component, a flat rise of the second ditch in the region of the flank length L with an angle of inclination $\alpha$ of about 3° to 7° and a height H adjusts itself, where H = height of silicon layer above the pn-junction taken at ½ L, and where $\alpha$ = angle of inclination of L taken at ½ L, and (f) removing of the second etching mask.

In accordance with the invention, there is provided a method for manufacturing a silicon semiconductor component with a wafer-like silicon semiconductor body with an edge contour made by an etching technique, which has a p-region parallel to a principal surface of the semiconductor body, a n-region beneath the p-region and a pn-region, a more heavily doped p-region and a less heavily doped n-region, a passivating ditch in the principal surface extending between the more heavily doped p-region and the less heavily doped n-region, and the pn-junction leading into the passivating ditch, in which the edge contour has a flank length L which runs between the emergence of the pn-junction into the passivating ditch and the principal surface of the semiconductor body, comprising the following process steps for preparing the passivating ditch:

(a) applying a first etching mask with an aperture on the principal surface of the silicon semiconductor component for the preparation of a wide ditch, in which the aperture of the first etching mask is placed asymmetrically to a reference surface M which goes through the center of a second small ditch to be made subsequently, and where a larger distance R of the first etching mask from the reference surface is chosen on the side facing the active part of the silicon semiconductor component, where the large distance R corresponds to the sum of the flank length L to be made and a small distance S of a second etching mask to be applied later for making the second small ditch from the reference surface M, (b) etching the first wide ditch down to a first depth T3 just above the pn-junction 4, where the height H is to be adjusted in the center of the flank length L, (c) removing the first etching mask, (d) applying a second etching mask on the principal surface of the silicon semiconductor component with an aperture of the etching mask in the region of the reference surface M with the small distance S on both sides, from the edges of the etching mask to reference surface M, (e) etching of the second small ditch down to a second depth T4 which goes beyond the pn-junction, and (f) removing the second etching mask.

There is provided in accordance with the invention a silicon semiconductor component with a wafer-like silicon semiconductor body with an edge contour made by an etching technique, comprising a p-region parallel to a principal surface of the semiconductor body, a n-region beneath the p-region, a pn-junction, a more heavily doped p-region and a less heavily doped n-region, a passivating ditch in the principal surface between the more heavily doped n-region and the pn-junction leading into the passivating ditch, in which the edge contour has a flank length designated L, which runs between the emergence of the pn-junction into the passivating ditch and the principal surface of the semiconductor body, and has a small angle of inclination designated α of 1° to 7° with the angle of inclination α of the edge contour nearly uniform over the major part of the flank length L and with the following relationships apply:

$L = (0.8 \ldots 1.6) \cdot x_n$ and $H = (0.5 \ldots 1.2) \cdot x_p$, where

H = the height of the p-doped silicon layer over the pn-junction, measured in the center of the flank length L, n = the extent of the space charge zone into the n-region, $x_p$ = the extent of the space charge zone into the p-region at cut-off voltage of the component. Other features which are considered as characteristic for the invention are set forth in the appended claims.

Although the invention is illustrated and described herein as embodied in silicon semiconductor component with an edge contour made by an etching technique, and method for manufacturing this component, it is nevertheless not intended to be limited to the details shown, since various modifications may be made therein without departing from the spirit of the invention and within the scope and range of equivalents of the claims.

BRIEF DESCRIPTION OF THE DRAWING

The construction and method of operation of the invention, however, together with additional objects and advantages thereof will be best understood from the following description of specific embodiments when read in connection with the accompanying drawing, in which.

DESCRIPTION OF THE PREFERRED EMBODIMENTS

Figure 1:
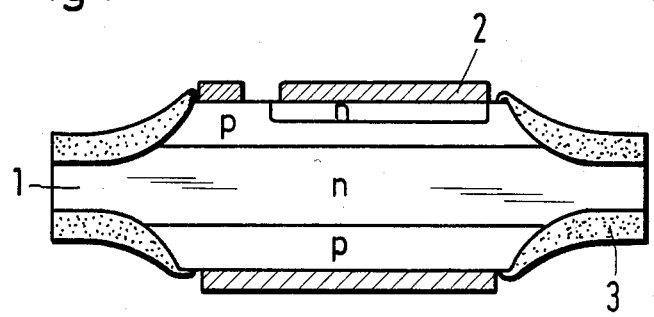
FIG. 1 shows a semiconductor component in cross section according to the state of the art, in Mesa technology.
Figure 2:
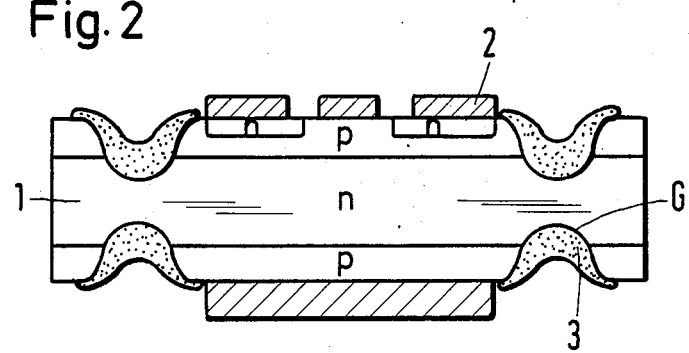
FIG. 2 is a semiconductor component in cross section according to the state of the art in Mesa technology with a passivating ditch similar to a moat.

According to the invention, semiconductor components with breakdown voltages of at least 1600 V can be manufactured. No stringent requirements as to the tolerances need to be met for the geometry of the ditch. The components can therefore be produced in quantity by etching techniques. It is also advantageous that the pn-junctions are located sufficiently far from the edges of the ditch into the interior of the ditches, such that in the event of vitrification faults (for glass passivation) at the edges, the coverage of the pn-junctions is not adversely influenced. However, vitrification faults are not expected since the step height at the edges of the ditch are reduced to about one half and relatively obtuse angles occur, the covering of which poses no problems. Instead of glass passivation, other passivation types can also be provided.

Further advantages can be gathered from the embodiment examples which will be described, referring to the drawings.

Figure 3:
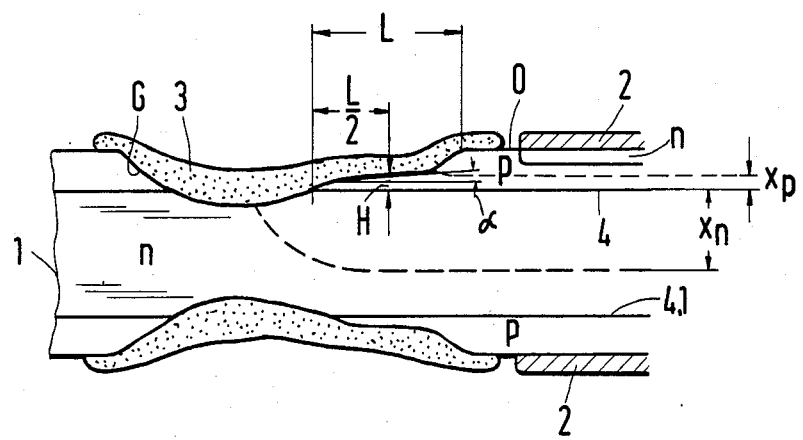
FIG. 3 illustrates a semiconductor component in cross section with an edge contour according to the invention. In the top view, the component may have any shape (for instance round or rectangular)

FIG. 3 shows the edge zone of a silicon semiconductor component 1 according to the invention which is designed as a moat, with a metallization 2 on its surface 0. The edge zone has, on the top and underside of the silicon semiconductor component 1, a ditch G which is filled with passivating glass 3. The passivating glass 3 extends somewhat beyond the edge of the ditch in order to increase the insulation path. The ditch G goes through a pn-junction 4 and extends all the way into an n-conduction region. A first extent $x_p$ of the space charge zone from the pn-junction 4 into a p-conduction area is shown by a dashed line. A second extent $x_n$ of the space charge zone from the pn-junction 4 into the n-conduction area is likewise shown by a dashed line. The dimensions $x_n$, $x_p$ of the space charge zone adjust themselves when the cut-off voltage is applied to the pn-junction 4 of the silicon semiconductor component 1.

The design of the ditch G is important. For space reasons, the ditch G is made asymmetrical with a smaller rise on the side facing the active part of the silicon semiconductor component 1. In FIG. 3, the active part of the silicon semiconductor component 1 is shown on the right-hand side. The level of the attainable breakdown voltage is governed by the design of the ditch contour in the area of a flank length L. The flank length L indicates the section of the ditch G in the vicinity between the pn-junction 4 and the surface 0 of the silicon semiconductor 1. It is designed in accordance with the equation $$L = (0.8 \ldots 1.6) \cdot x_n. \quad (1)$$

The height H of the silicon layer above the pn-junction 4, measured at half the flank length L is designed in accordance with the equation $$H = (0.5 \ldots 1.2) \cdot x_p. \quad (2)$$

At one half the flank length L, an angle of inclination α is also measured which indicates the inclination of the flank (ditch wall) relative to the pn-junction 4.

Figure 4:
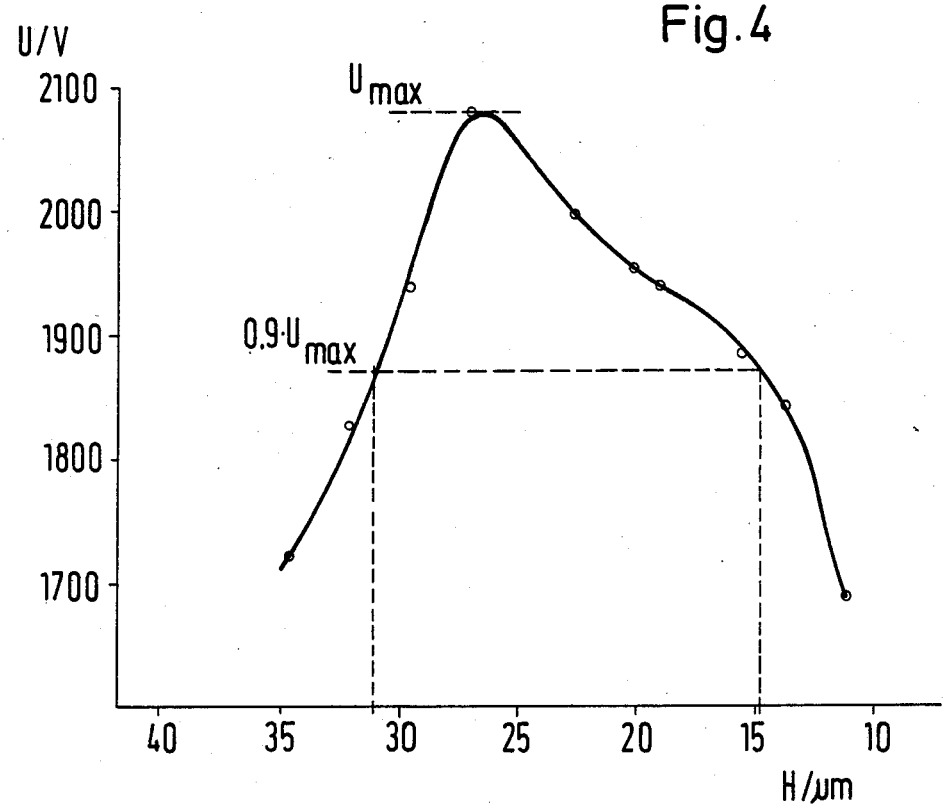
FIG. 4 is a presentation of measured breakdown voltages in a silicon semiconductor component according to the invention.

The bottom of the ditch G has a nearly continuously oblique shape in the region of the flank length L. This represents a substantial difference from the already mentioned paper by Temple and Adler, where a course of the flank substantially parallel to the pn-junction 4 is provided. This is of considerable practical importance since the tolerance with which the height H is set can be substantially larger if the flank is oblique than with a flat design. To this end, breakdown voltages U measured on silicon semiconductor components 1 according to the invention are shown in FIG. 4 as a function of the height H adjusted by differently deep etching, i.e. by different etching times, over the pn-junction 4. The measured maximum breakdown voltage $U_{max}$ (=cut-off voltage) nearly corresponds to the bulk breakdown voltage of the component. It can be seen from FIG. 4 that, with a tolerance of 16 $\mu$m for the adjustment with the height H over the pn-junction 4, at least 90% of the maximum voltage are reached. On the other hand, for a diffusion profile of the same kind according to the state of the art (see the papers by Temple and Adler mentioned above), only a tolerance value of 4 $\mu$m is calculated for maintaining the height H. So narrow a tolerance cannot be kept in practical production.

The preparation of a ditch G with the shape shown in FIG. 3 and described by equations (1) and (2) can be accomplished in different ways.

Figure 5:
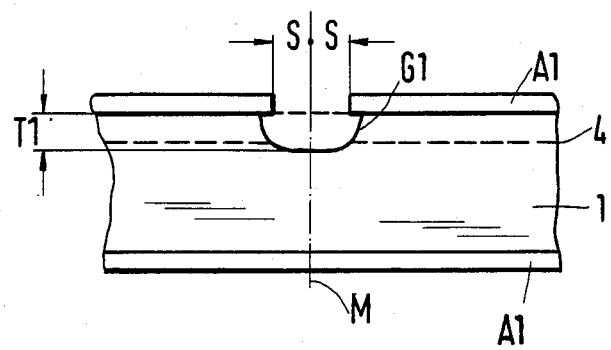
FIG. 5 shows a semiconductor component with a first etching mask for masking a passivation ditch in accordance with a first manufacturing method.
Figure 6:
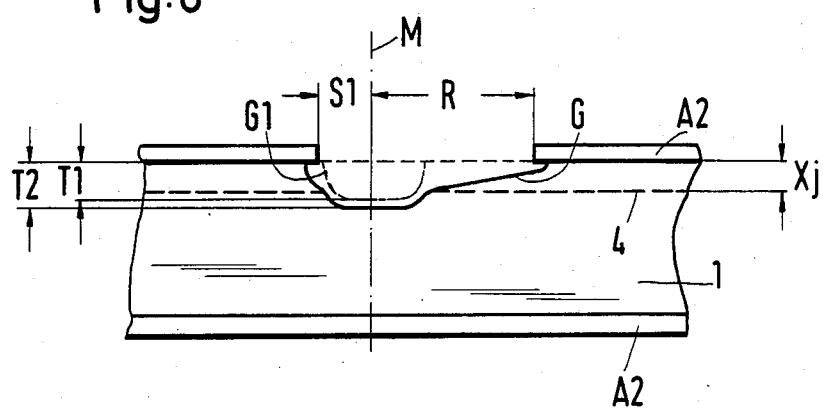
FIG. 6 shows the semiconductor component with a second etching mask for manufacturing the passivating ditch according to the first manufacturing method.

For ditches G with a flank length L of about 110 to 220 $\mu$m (corresponding to components with a blocking voltage of about 1600 V), a first manufacturing method illustrated in FIGS. 5 and 6 is best suited and preferred. An angle of inclination of about 1° to 3° is obtained thereby. The first manufacturing method will be described in the following with reference to FIGS. 5 and 6. FIG. 5 shows a silicon semiconductor component 1 with a pn-junction 4. The active part of the silicon semiconductor component 1 is on the right side in the views of FIGS. 5 to 8. In addition, the dimensions for the masking are referred in FIGS. 5 to 8 to a reference surface M. The reference surface M goes through the center of a narrow ditch G1, G3, which is made first in the first manufacturing method. For this purpose, a first etching mask A1 is applied to the silicon semiconductor component 1 in a first process step. At the point where the narrow ditch G1 is to be etched, the mask A1 has an opening, the edges of the mask A1 to the left and right are spaced a small distance S from the reference surface M.

In a second process step, a narrow ditch G1 is etched down to a first depth T1 which just extends beyond the pn-junction 4. Thereafter, the etching mask A1 is removed in a third process step.

In the fourth process step, a second etching mask A2 is applied to the silicon semiconductor component 1, as shown in FIG. 6.

The opening of the etching mask A2 in the vicinity of the ditch G1 is designed asymmetrically to the reference surface M. The distance S1 of the edge of the etching mask A2 on the side of the left of the reference surface M is non-critical, because the left part of the silicon semiconductor component 1 involves the inactive edge region. This distance S1 corresponds approximately to one-half the width of the narrow ditch G1.

The large distance R, shown in FIG. 6, of the right-hand edge of the mask from the reference surface M is essential, because the shape of the ditch is thereby determined in the active part of the silicon semiconductor component 1. The desired shape of the ditch with the flank length L appears if the small distance S of the two edges of the first etching mask A1 from the reference surface M and the large distance R of the right-hand edge of the second etching mask A2 from the reference surface M meet the following relation:

$$R - S = L + x_j/2. \tag{3}$$

Here, $x_j$ is the depth of the pn-junction 4 entered in FIG. 6.

The etching of the desired ditch G takes place in the fifth process step. The etching is chosen so that the height H defined by equation (2) adjust itself. The originally narrow ditch G1 is etched here somewhat deeper down to a second depth T2 and on the right-hand side of the ditch, the desired inclined flank appears.

In the sixth process step, the etching mask A2 is finally removed.

The form of the ditch according to the invention can also be prepared by a second manufacturing method which will be described in the following, making reference to FIGS. 7 and 8. This second method is particularly well suited for preparing a ditch G with a flank length L=55 to 110 $\mu$m for silicon semiconductor components 1 with a breakdown voltage of up to about 800 V. The angle of inclination $\alpha$ shown in FIG. 3 is here about 3° to 7°.

Figure 7:
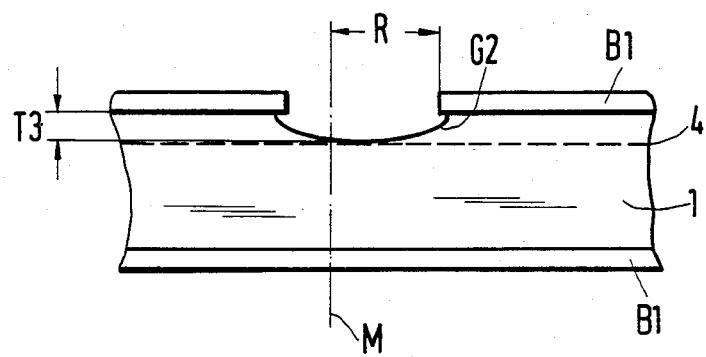
FIG. 7 shows a semiconductor component with a first etching mask for manufacturing a passivating ditch according to a second manufacturing method.

In FIG. 7, a silicon semiconductor component 1 with a pn-junction 4 and a first etching mask B1 is shown. Mask B1 is applied to silicon component 1 in a first process step. The mask aperture for preparing a wide ditch G2 is placed asymmetrically to the reference surface M which goes through the center of a small ditch G3 which can be made in a later process step (FIG. 8). The edge of the mask on the right-hand side of the reference surface M, i.e. on the active side of the silicon semiconductor component 1, has a large distance R. The relationship between the large distance R for the first etching mask B1 and the small distance S for the etching mask B2, to be applied in a later process step, (FIG. 8) to the desired flank length L is given by Equation $$R - S = L. \tag{4}$$

In the second process step, an etching operation for making the wide ditch G2 is performed down to a first depth T3 just above the pn-junction 4. Subsequently, the mask B1 is removed in the third process step.

Figure 8:
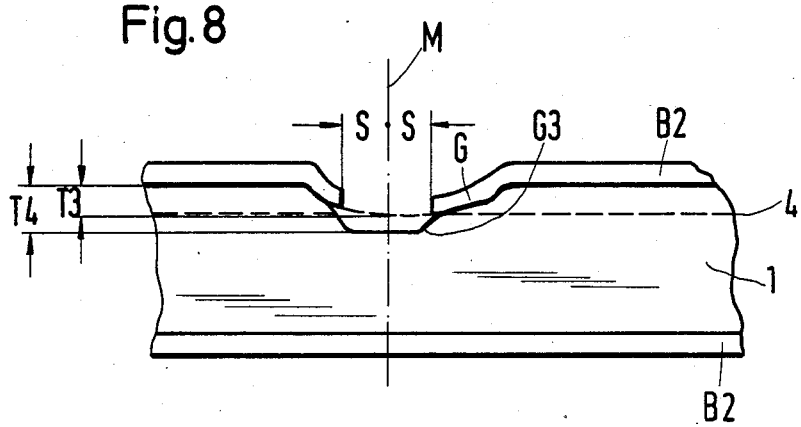
FIG. 8 is the semiconductor component with a second etching mask for manufacturing the passivating ditch according to the second manufacturing method.

In the fourth process step, a second etching mask B2 is applied as is shown in FIG. 8. The mask B2 covers the finished part of the ditch G and has an aperture with a small left-hand and a right-hand distance S from the reference surface M. In the fifth process step, the small ditch G3 is etched down to a second depth T4 which goes beyond the pn-junction 4. In this process, the desired form of the ditch G is generated. In the sixth step, the second etching mask B2 is removed.

If the first method were used for components which require a flank length L of 55 to 110 $\mu$m, then the resulting angle $\alpha$ would be larger than 3° to 7°. Therefore, the second method is preferred for such components; it yields smaller angles $\alpha$ in this range of the flank length L than the first method.

In addition to the above-described manufacturing methods, in which two etching masks are used sequentially, other manufacturing methods are feasible. One can work, for instance, with a single etching mask providing different etching mixtures are used successively. First, an etching mixture with an etching rate as independent as possible of the doping is used and thereafter an etching mixture with a heavily doping-dependent etching rate is used. The last-mentioned etching mixture attacks primarily the highly doped regions. With the first etching mixture, a ditch of uniform depth is prepared which is widened by means of the second etching mixture mainly in the highly doped region.

The foregoing is a description corresponding, in substance, to German application No. P 34 22 051, dated June 14, 1984, International priority of which is being claimed for the instant application, and which is hereby made part of this application. Any material discrepancies between the foregoing specification and the specification of the aforementioned corresponding German application are to be resolved in favor of the latter.

There is claimed:

1. Method for manufacturing a silicon semiconductor component with a wafer-like silicon semiconductor body with an edge contour made by an etching technique, which has a p-region parallel to a principal surface of the semiconductor body, a n-region beneath the p-region and a pn-region, a more heavily doped p-region and a less heavily doped n-region, a passivating ditch in the principal surface extending between the more heavily doped p-region and the less heavily doped n-region, and the pn-junction leading into the passivating ditch, in which the edge contour has a flank length L which runs between the emergence of the pn-junction into the passivating ditch and the principal surface of the semiconductor body, comprising the following process steps for preparing the passivating ditch:

(a) applying a first etching mask on the principal surface of the silicon semiconductor component with an opening in the etching mask above the region of a narrow first ditch to be formed, with the opening in the mask a small distance S to the edges of the etching mask from a reference surface M going through the center of the ditch, (b) etching the narrow ditch down to a first depth T1 which just goes beyond the pn-junction, (c) removing the first etching mask, (d) applying a second etching mask to the principal surface of the silicon semiconductor component, with an aperture of the second etching mask above the first ditch disposed asymmetrically to the reference surface M, in that the second etching mask terminates on the side of the not used edge region of the silicon semiconductor component approximately with the edge of the first ditch and terminates on the side of the active part of the silicon semiconductor component with a large distance R from the reference surface M, where the large distance R is chosen in relation to the small distance S of the first etching mask, according to the equation $$R-S=L+x_j/2,$$

where $x_j$ is the depth of the pn-junction below the principal surface, (e) etching a second passivating ditch in the region of the narrow first ditch prepared previously until the first ditch is etched further down to a second depth T2 and, on the side of the active part of the silicon semiconductor component, a flat rise of the second ditch in the region of the flank length L with an angle of inclination $\alpha$ of about 3° to 7° and a height H adjusts itself, where H=height of silicon layer above the pn-junction taken at $\frac{1}{2}$ L, and where $\alpha$=angle of inclination of L taken at $\frac{1}{2}$ L, and (f) removing of the second etching mask.

2. Method for manufacturing a silicon semiconductor component with a wafer-like silicon semiconductor body with an edge contour made by an etching technique, which has a p-region parallel to a principal surface of the semiconductor body, a n-region beneath the p-region and a pn-region, a more heavily doped p-region and a less heavily doped n-region, a passivating ditch in the principal surface extending between the more heavily doped p-region and the less heavily doped n-region, and the pn-junction leading into the passivating ditch, in which the edge contour has a flank length L which runs between the emergence of the pn-junction into the passivating ditch and the principal surface of the semiconductor body, comprising the following process steps for preparing the passivating ditch:

(a) applying a first etching mask with an aperture on the principal surface of the silicon semiconductor component for the preparation of a wide ditch, in which the aperture of the first etching mask is placed asymmetrically to a reference surface M which goes through the center of a second small ditch to be made subsequently, and where the larger distance R of the first etching mask from the reference surface is chosen on the side facing the active part of the silicon semiconductor component, where the large distance R corresponds to the sum of the flank length L to be made and a small distance S of a second etching mask to be applied later for making the second small ditch from the reference surface M, (b) etching the first wide ditch down to a first depth T3 just above the pn-junction 4, where the height H is to be adjusted in the center of the flank length L, (c) removing the first etching mask, (d) applying a second etching mask on the principal surface of the silicon semiconductor component with an aperture of the etching mask in the region of the reference surface M with the small distance S on both sides, from the edges of the etching mask to reference M, (e) etching of the second small ditch down to a second depth T4 which goes beyond the pn-junction, and (f) removing the second etching mask.

3. Method for manufacturing a silicon semiconductor component according to claim 1 in two etching steps, wherein the width of the opening of the first etching mask corresponds nearly to the deep part of the first ditch, (b) the first etching is carried out with an etching mixture which attacks the doped and undoped silicon areas at about the same etching rate, and (c) the second etching is carried out with an etching mixture which attacks primarily the highly doped regions and the ditch is widened in the upper part.

4. Method according to claim 1, wherein the passivating ditch is made as a moat.

5. Method according to claim 2, wherein the passivating ditch is made as a moat.

6. Silicon semiconductor component with a wafer-like silicon semiconductor body with an edge contour made by an etching technique, comprising a p-region parallel to a principal surface of the semiconductor body, a n-region beneath the p-region, a pn-junction, a more heavily doped p-region and a less heavily doped n-region, a passivating ditch in the principal surface between the more heavily doped n-region and the pn-junction leading into the passivating ditch, in which the edge contour has a flank length designated L which runs between the emergence of the pn-junction into the passivating ditch and the principal surface of the semiconductor body, and has a small angle of inclination designated $\alpha$ of 1° to 7° with the angle of inclination $\alpha$ of the edge contour nearly uniform over the major part of the flank length L and that the following relationships:

$L = (0.8 \ldots 1.6) \cdot x_n$ and $H = (0.5 \ldots 1.2) \cdot x_p$, where $H$ = the height of the p-doped silicon layer over the pn-junction, measured in the center of the flank length L, $x_n$ = the extent of the space charge zone into the n-region, $x_p$ = the extent of the space charge zone into the p-region at cut-off voltage of the component.

* * * * *